US011437970B2

(12) United States Patent
Li et al.

(10) Patent No.: US 11,437,970 B2
(45) Date of Patent: Sep. 6, 2022

(54) METHOD AND APPARATUS FOR COMMON-MODE VOLTAGE CANCELLATION

(71) Applicant: GE Aviation Systems LLC, Grand Rapids, MI (US)

(72) Inventors: Cong Li, Schenectady, NY (US); Xiaochuan Jia, Centerville, OH (US)

(73) Assignee: GE Aviation Systems LLC, Grand Rapids, MI (US)

( * ) Notice: Subject to any disclaimer, the term of this patent is extended or adjusted under 35 U.S.C. 154(b) by 0 days.

(21) Appl. No.: 17/146,746

(22) Filed: Jan. 12, 2021

(65) Prior Publication Data

US 2022/0224301 A1     Jul. 14, 2022

(51) Int. Cl.
*H03H 7/06*     (2006.01)
*H03H 1/00*     (2006.01)
*H03H 7/42*     (2006.01)

(52) U.S. Cl.
CPC .............. *H03H 7/06* (2013.01); *H03H 7/427* (2013.01); *H03H 1/0007* (2013.01)

(58) Field of Classification Search
CPC ......... H03H 7/427; H03H 1/0007; H03H 7/06
USPC ........................................ 333/172, 177, 181
See application file for complete search history.

(56) References Cited

U.S. PATENT DOCUMENTS

| 5,852,558 | A | 12/1998 | Julian et al. |
| 7,898,827 | B2 | 3/2011 | Ganev et al. |
| 8,502,539 | B2 | 8/2013 | Lai et al. |
| 9,551,767 | B2 | 1/2017 | Sabate et al. |
| 9,882,464 | B1 | 1/2018 | Li et al. |
| 10,498,244 | B2 | 12/2019 | Horwitz et al. |
| 11,251,693 | B2 | 2/2022 | Rasek et al. |
| 2006/0220972 | A1 | 10/2006 | Saitoh |
| 2010/0259240 | A1 | 10/2010 | Cuk |
| 2018/0248491 | A1 | 8/2018 | McMahon et al. |
| 2020/0313641 | A1* | 10/2020 | Matsunaga ............. H03H 7/06 |

FOREIGN PATENT DOCUMENTS

| CN | 111581902 A | 8/2020 |
| DE | 102018209740 A1 | 12/2019 |
| EP | 2249477 A1 | 11/2010 |
| JP | 2014216997 A | 11/2014 |
| WO | 2019238707 A1 | 12/2019 |

* cited by examiner

*Primary Examiner* — Rakesh B Patel
(74) *Attorney, Agent, or Firm* — McGarry Bair PC

(57) ABSTRACT

A common-mode voltage cancellation (CMVC) circuit, is disclosed. The circuit includes a set of input lines arranged to receive a respective phase voltage, and a set of output lines arranged to provide a respective output phase voltage. The circuit further includes a set of coupled inductors, each having a respective primary winding and secondary winding coupled in signal communication at a respective upstream end to a respective input line to receive a respective phase voltage therefrom, each respective phase voltage having a common-mode voltage component. Each primary winding being coupled at a respective downstream end to ground, and each secondary winding being coupled in series between the respective input line and a respective output line. The circuit includes a set of capacitors, each capacitor being electrically coupled to a respective input line and in series with a respective primary winding of the set of coupled inductors.

18 Claims, 3 Drawing Sheets

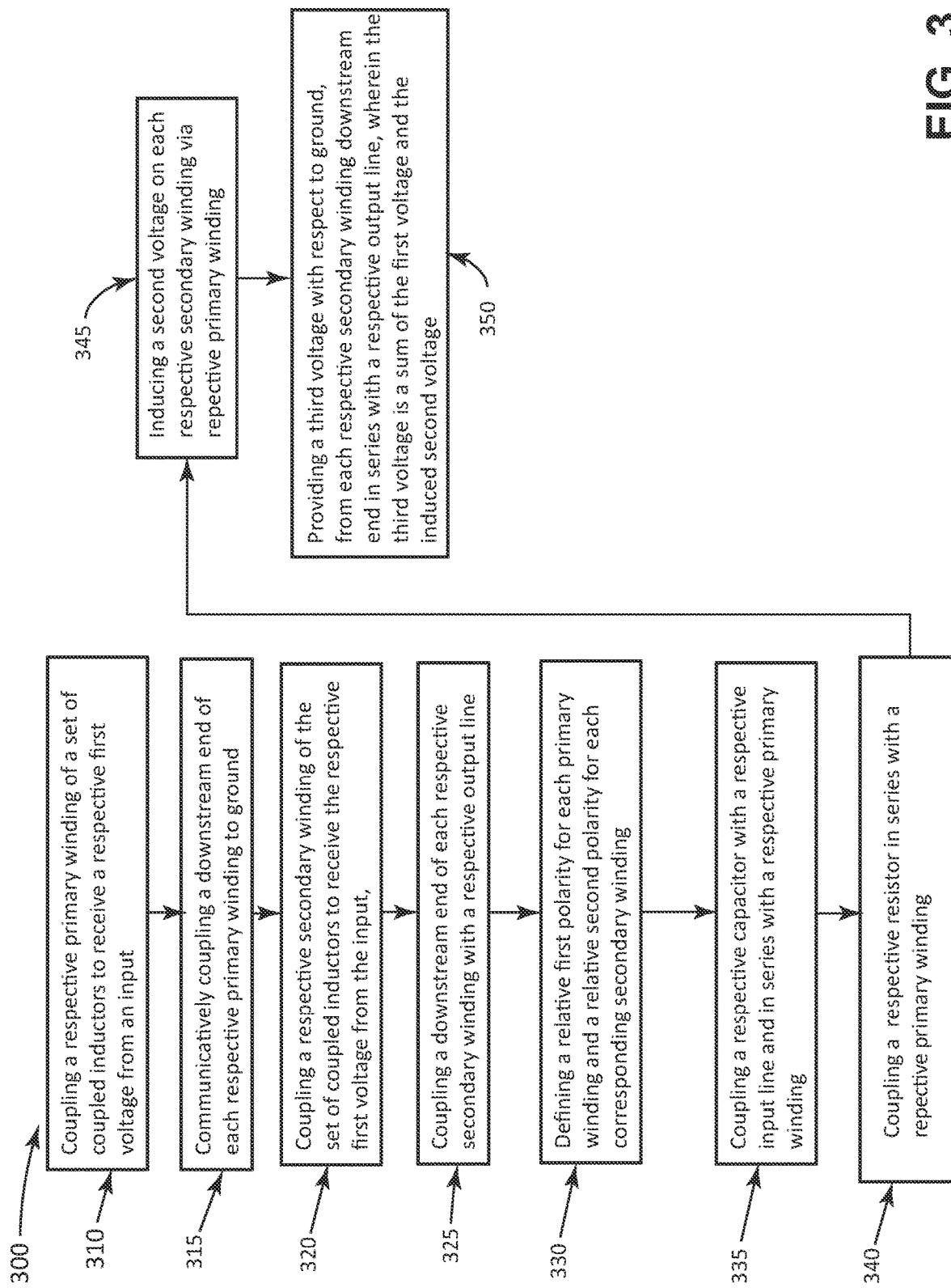

METHOD AND APPARATUS FOR COMMON-MODE VOLTAGE CANCELLATION

TECHNICAL FIELD

This disclosure relates to filters for electrical circuits, and more particularly to a filter circuit for reducing a common-mode voltage provided to an electrical load.

BACKGROUND

High-speed switching devices such as bipolar transistors, metal-oxide-semiconductor field-effect transistors (MOSFETs) and insulated-gate bipolar transistors (IGBTs) have enabled increased switching frequencies for voltage-source pulse width modulated (PWM) inverters and direct current-direct current (DC-DC) converters thus leading to improved operating characteristics. High-speed switching techniques, however, present some drawbacks, as a consequence of the faster rate-of-change in the voltage associated with the high-speed switching.

This associated voltage change produces high-frequency oscillatory common-mode voltage and differential-mode voltage when the switching devices change state, for instance from a conducting state to a non-conducting state, at least in part because of parasitic stray capacitance in the load (e.g., a motor). Accordingly, each time an inverter switching event occurs, the voltage of the corresponding inverter output terminal with respect to ground changes rapidly, and a pulse of common-mode current flows in the direct current (DC) link to the inverter, via the capacitance of the motor cable and motor windings, relative to ground. These high-frequency common-mode voltages and currents due to switching in power converters and inverters introduces numerous well-known problems in electrical systems.

BRIEF DESCRIPTION

In one aspect, the present disclosure relates to a common-mode voltage cancellation (CMVC) circuit. The CMVC circuit includes a set of input lines arranged to receive a respective phase voltage, a set of output lines arranged to provide a respective output phase voltage, and a set of coupled inductors, each coupled inductor of the set of coupled inductors having a respective primary winding, and a respective secondary winding. Each primary winding and secondary winding are coupled in signal communication at a respective upstream end to a respective input line to receive a respective phase voltage therefrom, and each respective phase voltage includes common-mode voltage component. Each primary winding of the set of coupled inductors is coupled at a respective downstream end to ground, each secondary winding of the set of coupled inductors is coupled in series between the respective input line and a respective output line. The circuit also includes a set of capacitors, each capacitor of the set of capacitors being electrically coupled in series with a respective primary winding of the set of coupled inductors.

In another aspect, the present disclosure relates to a method of cancelling a common-mode voltage in a circuit. The method includes communicatively coupling a respective upstream end of a respective primary winding of a set of coupled inductors with a respective input line to receive a respective first phase voltage having a common mode voltage component Vcm, therefrom, communicatively coupling a downstream end of each respective primary winding to ground, communicatively coupling a respective upstream end of each respective secondary winding of the set of coupled inductors with a respective input line to receive the respective first phase voltage having a common mode voltage component therefrom. The method further includes communicatively coupling a downstream end of each respective secondary winding with a respective output line in series with a respective input line, coupling a respective capacitor electrically in series with a respective primary winding, inducing a second voltage on each respective secondary winding via a respective primary winding of the set of coupled inductors; and coupling a third voltage with respect to ground, from each respective secondary winding downstream end in series with a respective output line, wherein the third voltage comprises a sum of the first voltage and the induced second voltage.

These and other features, aspects and advantages of the present disclosure will become better understood with reference to the following description and appended claims. The accompanying drawings, which are incorporated in and constitute a part of this specification, illustrate aspects of the disclosure and, together with the description, serve to explain the principles of the disclosure.

BRIEF DESCRIPTION OF THE DRAWINGS

A full and enabling disclosure of the present description, including the best mode thereof, directed to one of ordinary skill in the art, is set forth in the specification, which refers to the appended FIGS., in which:

FIG. 3 is a flow diagram of a method of a voltage cancellation in accordance with various aspects described herein.

DETAILED DESCRIPTION

Figure 1:
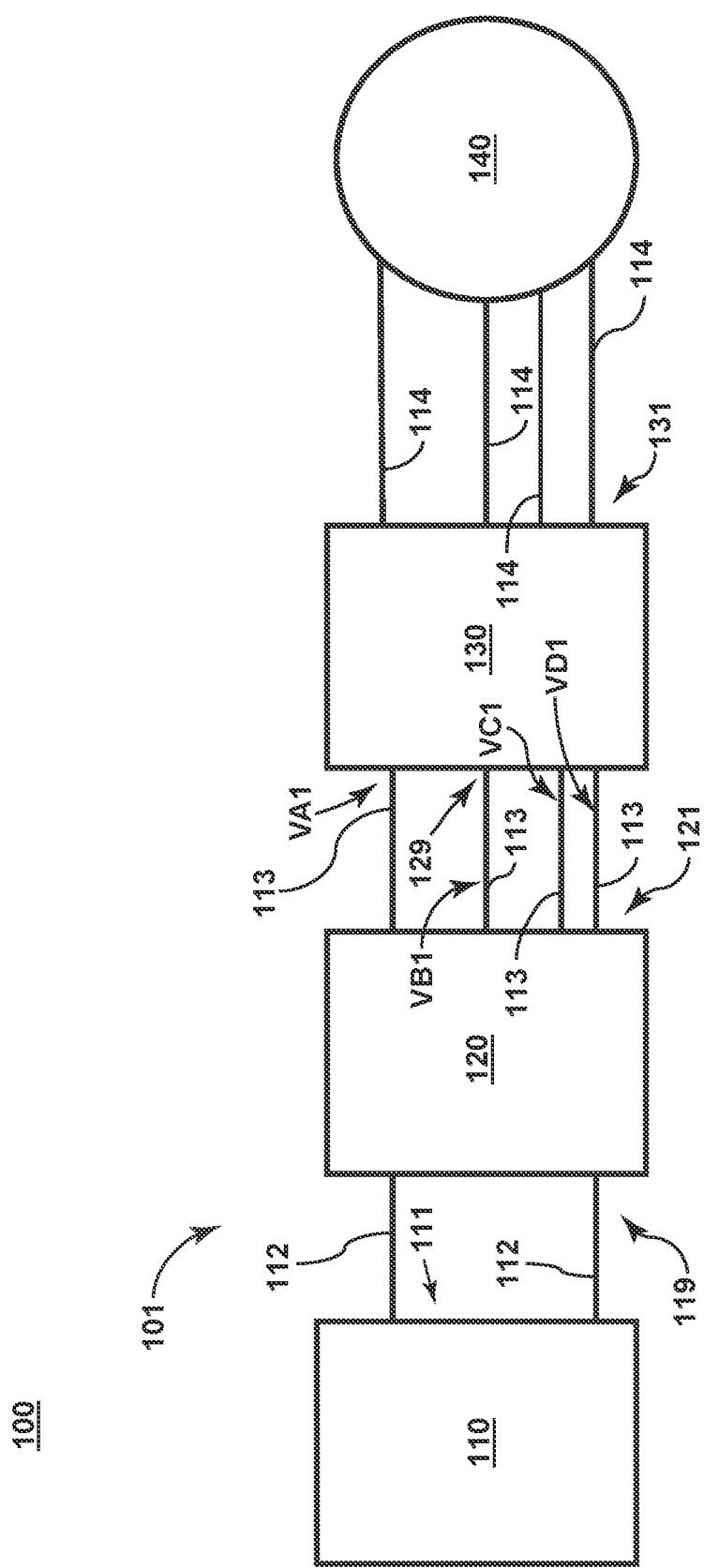
FIG. 1 illustrates schematic view of a power circuit in accordance with various aspects described herein.

Aspects of the disclosure can be implemented in any environment, apparatus, or method for reducing a common-mode voltage in a circuit regardless of the function performed by the circuit.

As used herein, the term "set" or a "set" of elements can be any number of elements, including only one. Additionally, as used herein, the term "upstream" refers to a direction that is opposite a fluid or an electron flow direction, and the term "downstream" refers to a direction that is in the same direction as the fluid or electron flow. For example, with respect to a device having an input side and an output side, the term "upstream" refers to a direction toward the input side, and the term "downstream" refers to a direction toward the output side. Additionally, while terms such as "voltage", "current", and "power" can be used herein, it will be evident to one skilled in the art that these terms can be interrelated when describing aspects of the electrical circuit, or circuit operations.

Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements. Non-limiting example power distribution bus connections or disconnections can be enabled or operated by way of switching, bus tie logic, or any other connectors configured to enable or disable the energizing of electrical loads downstream of the bus. Additionally, as used herein, "electrical connection" or "electrically coupled" can include a wired or wireless connection. The exemplary drawings are for purposes of illustration only and the dimensions, positions, order and relative sizes reflected in the drawings attached hereto can vary.

Furthermore, the number of, and placement of, the various components depicted the Figures are also non-limiting examples of aspects associated with the disclosure. For example, while various components have been illustrated with relative position of etc., aspects of the disclosure are not so limited, and the components are not so limited based on their schematic depictions.

With reference to FIG. 1, an aspect of a power distribution circuit 100 is depicted in block diagram form. The power distribution circuit 100 can include at least one power supply 101 electrically coupled to an electrical load 140. The power supply 101 can comprise a power source 110 having a power source output 111, an inverter 120, having an inverter input 119 and an inverter output 121, and a CMVC circuit 130 having a CMVC circuit input 129 and a CMVC circuit output 131. The power source output 111 can be connected to the inverter input 119 by way of transmission lines 112. The inverter output 121 can be connected to the CMVC circuit input 129 of the CMVC circuit 130, via a set of power transmission or input lines 113. The CMVC circuit output 131 (e.g., a voltage) can be connected with the electrical load 140 via a set of power transmission or output lines 114 such as bus bars or cables, to provide electrical power thereto. In an aspect, each output line 114 is coupled electrically in series with a corresponding input line 113. In an aspect, the power supply 101 can comprise for example, a conventional DC power source 110, including but not limited to, a battery, photovoltaic panel, DC power supply, any other known source of DC electrical power, or a combination thereof. The DC power from the power source 110 can be provided to the transmission lines 112, which ultimately delivers the electrical power to the electrical load 140, coupled to the power supply 101. In other aspects, the power supply 101 can comprise a conventional alternating current (AC) power source 110, such as a generator, or the like.

In one non-limiting example, the electrical DC output of the power source 110 can be provided via the transmission lines 112, to the inverter input 119 of. The inverter 120 can include any power inverter adapted or configured to invert the DC power received at the inverter input 119 to AC electrical power. The AC electrical power is then provided at the inverter output 121 and transmitted therefrom via the power transmission input lines 113 to the CMVC circuit input 129. For example, in an aspect, the inverter 120 can provide a polyphase AC voltage. In non-limiting aspects the polyphase AC voltage can comprise a three-phase voltage, wherein each conductor provides a respective phase voltage (hereafter, designated first phase voltages VA1, VB1, VC1, respectively) at the inverter output 121 to a respective power transmission input line 113, which in turn can provide the respective phase voltage VA1, VB1, VC1 received from inverter 120 to the CMVC circuit 130. In other non-limiting aspects, the inverter output 121 can include a polyphase output provided to four input lines 113 (e.g., an inverter having a 3-phase, 4-wire output). In such aspects a fourth input line 113 can provide a fourth phase voltage VD1. In non-limiting aspects, the fourth phase voltage VD1 can be a neutral voltage. The CMVC circuit input 129 is coupled to the inverter output 121 via the power transmission or input lines 113 to receive the AC voltage VA1, VB1, VC1, VD1 therefrom. In various aspects, each power transmission input line 113 can correspond to a respective AC phase of the inverter output 121.

With continued reference to FIG. 1, schematic aspects of the CMVC circuit 130 will be described in more detail. The CMVC circuit 130 is electrically coupled in signal communication with the inverter 120 and can receive the AC electrical power from the inverter output 121, at the CMVC circuit input 129, via conductors such as the input lines 113. For example, the AC electrical power can be provided to the CMVC circuit 130 as a conventional polyphase AC differential mode voltage (phases denoted VA1, VB1, VC1, and VD1), with respect to ground (GND) or neutral, and having any desired fundamental frequency. The respective first phase voltages VA1, VB1, VC1, VD1 provided by the inverter 120 can additionally comprise a respective common mode voltage component in phase with the respective first phase voltages VA1, VB1, VC1, VD1. In a conventional polyphase AC system (e.g., a three-phase AC system), such a common mode voltage at the output of an inverter typically comprises a voltage difference between the power source and ground or the neutral point of the polyphase load having a frequency higher than the fundamental frequency of the phase voltages VA1, VB1, VC1, VD1. More specifically, power supplies and inverters (e.g. inverter 120) typically have an output phase voltage component with a low fundamental frequency (e.g., 400 Hertz) and a common mode voltage component having a high-frequency component (e.g., 20 kilohertz) due to the high-speed switching operation of the inverter switches. The common-mode voltage component can appear on each line of the multi-line circuit, in-phase with the respective phase voltage, having an amplitude that is an average of the voltages from each line, and having a higher frequency than the fundamental frequency of the phase voltage.

Each first phase voltage VA1, VB1, VC1, VD1, including the respective common mode voltage component, can be provided to the CMVC circuit 130 on separate respective power transmission input lines 113. It will be understood that while the figures depict the CMVC circuit 130 as receiving a conventional polyphase AC voltage VA1, VB1, VC1, VD1 from the inverter 120 via four input lines 113 (i.e., one respective input line 113 per phase or neutral), aspects of the disclosure are not so limited. It is contemplated that aspects of the CMVC circuit 130 can comprise any desired number of AC or DC voltage inputs, receivable at the CMVC circuit input 129, and having any desired number of phase and frequency orientations, on any number of desired power transmission input lines 113, with or without a neutral, without departing from aspects of the disclosure described herein.

The illustrated aspect of FIG. 1 is only one non-limiting example of a power distribution circuit 100, and many other possible aspects, configurations, or the like, in addition to that shown are contemplated by aspects of the present disclosure. It will be understood that while aspects of the disclosure are shown, for ease of understanding, in the simple arrangement shown in FIG. 1, depicting a single power source 110, the disclosure is not so limited and has general application to electrical power systems or power distribution circuits 100 having any number of power sources.

Figure 2:
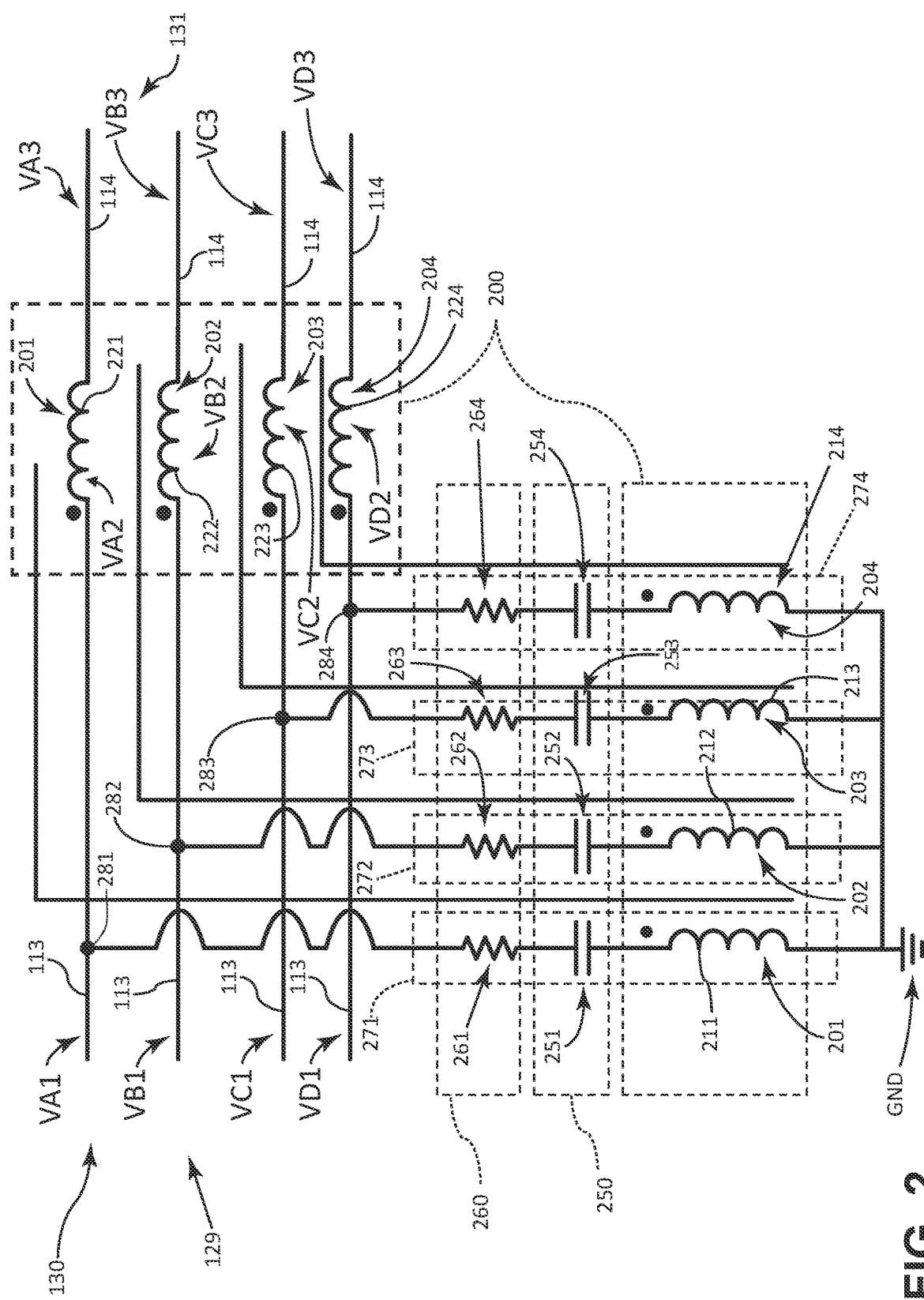
FIG. 2 is a schematic view of a common-mode voltage cancellation circuit in accordance with various aspects described herein.

With reference to FIG. 2, a non-limiting aspect of the CMVC circuit 130 is depicted in schematic form. The CMVC circuit 130 can comprise a set of coupled inductors 200 (for example, a first coupled inductor 201, a second coupled inductor 202, a third coupled inductor 203, and a fourth coupled inductor 204). In aspects, the CMVC circuit 130 can include a set of capacitors 250. In an aspect the set of capacitors 250 can include a first capacitor 251, a second capacitor 252, a third capacitor 253, and a fourth capacitor 254. In other aspects, the set of capacitors 250 can include any desired number of capacitors. For example, in some aspects the number of capacitors in the set of capacitors 250 can correspond to the number of coupled inductors in the set of coupled inductors 200. In some aspects, the CMVC circuit 130 can additionally include a set of resistors 260. In an aspect the set of resistors 260 can include a first resistor 261, a second resistor 262, a third resistor 263, and a fourth resistor 264. In other aspects, the set of resistors 260 can include any desired number of resistors. For example, in some aspects, the number of resistors in the set of resistors 260 can correspond to the number of coupled inductors in the set of coupled inductors 200.

Each coupled inductor 201, 202, 203, 204 of the set of coupled inductors 200 includes a respective primary winding 211, 212, 213, 214 and a respective secondary winding 221, 222, 223, 224. In an aspect, the primary windings 211, 212, 213, 214 of the set of coupled inductors 200 are arranged to define a first polarity, and the corresponding secondary windings 221, 222, 223, 224 are arranged to define second polarity. In an aspect, the respective first and second polarities can be identical. In other aspects, the respective first and second polarities can be opposite each other. The secondary windings 221, 222, 223, 224 can be disposed downstream of the CMVC circuit input 129 and proximate to the CMVC circuit output 131. Each secondary winding 221, 222, 223, 224 of the set of coupled inductors 200 can be associated with a respective input line 113 and a respective output line 114. For example, in an aspect, each secondary winding 221, 222, 223, 224 of the set of coupled inductors 200 can be coupled electrically in series with a respective input line 113, and a respective output line 114.

While FIG. 2 depicts an aspect of the CMVC circuit 130 comprising four input lines 113 provided to the input of the CMVC circuit 130, other aspects are not so limited. It is contemplated that other non-limiting aspects of the CMVC circuit 130 can comprise any desired number of AC or DC voltage inputs, receivable at the input 129 of the CMVC circuit 130, and having any desired number of phase and frequency orientations, on any number of desired power transmission input lines 113, without departing from aspects of the disclosure described herein. For example, in aspects the CMVC circuit can be a polyphase AC circuit having a number of electrical phases, wherein the set of coupled inductors 200 comprises at least N coupled inductors, where N is equal to the number of electrical phases in the CMVC circuit 130

It will be understood that a sinusoidal AC voltage applied to a coil (e.g., a coupled inductor primary winding) will induce a voltage in a second coil (e.g., a coupled inductor secondary winding) where the two are linked by a magnetic path (e.g., the coupled inductor core). The phase relationship of the two sinusoidal AC voltages (i.e., the primary and secondary voltages) will depend upon the polarity of the respective windings, and can be arranged to be either in-phase with each other, or displaced by 180 degrees. For example, as described herein, a "first polarity" winding matching with a second "first polarity" winding can be arranged such that the phase relationship of the two sinusoidal AC voltages at the primary and secondary voltages are in-phase with each other. In contrast, as described herein, a "first polarity" winding opposite a second "second polarity" winding can be arranged such that the phase relationship of the two sinusoidal AC voltages at the primary and secondary voltages are out of phase, or displaced by 180 degrees, relative to each other. The magnitude of the induced secondary voltage will depend on the turns or winding ratio of the primary winding to the secondary winding.

For ease of understanding and explanation, the aspect depicted in FIG. 2 is described herein as each coupled inductor 201, 202, 203, 204 of the set of coupled inductors 200 having a primary winding to secondary winding ratio of 1:1. It will be appreciated that each coupled inductor 201, 202, 203, 204 of the set of coupled inductors 200 may comprise any desired winding ratio without departing from the scope of the aspects herein. For example, in an aspect each coupled inductor 201, 202, 203, 204 of the set of coupled inductors 200 may comprise a winding ratio substantially equal to T:1, wherein T is greater than 1.

Each capacitor 251, 252, 253, 254 of the set of capacitors 250 can be arranged electrically in series with a respective primary winding 211, 212, 213, 214 of the set of coupled inductors 200. In an aspect, each capacitor 251, 252, 253, 254 of the set of capacitors 250 can be electrically coupled to an upstream end of a respective primary winding 211, 212, 213 of the set of coupled inductors 200. Additionally, in non-limiting aspects, each resistor 261, 262, 263, 264 of the set of resistors 260 can be electrically coupled in series with a respective capacitor 251, 252, 253, 254 of the set of capacitors 250. Accordingly, as can be seen in FIG. 2, each respective input line 113 can be coupled to ground via a respective resistor 261, 262, 263, 264 capacitor 251, 252, 253, 264 and primary winding 211, 212, 213, 214 electrically coupled in series between a respective input line 113 and ground. It will be appreciated that when so arranged, each respective resistor 261, 262, 263, capacitor 251, 252, 253, and primary winding 211, 212, 213, 214 can define a respective series resonant circuit 271, 272, 273, 274. For example, in aspects, the first resistor 261, first capacitor 251, and first primary winding 211 can define the first series resonant circuit 271; the second resistor 262, second capacitor 252, and second primary winding 212 can define the second series resonant circuit 272; the third resistor 263, third capacitor 253, and third primary winding 213 can define a third series resonant circuit 273; and the fourth resistor 264, fourth capacitor 254, and fourth primary winding 214 can define a fourth series resonant circuit 274.

Aspects of the CMVC circuit 130 can receive the respective first phase voltages VA1, VB1, VC1, VD1 from the inverter 120 at the CMVC circuit 130 input 129 via the input lines 113. The input lines 113 provide the respective first phase voltages VA1, VB1, VC1, VD1 to respective primary windings 211, 212, 213, 214 of the set of coupled inductors 200. When received by the CMVC circuit 130, the respective first phase voltages VA1, VB1, VC1, VD1 provided by the inverter (not shown), the respective first phase voltages VA1, VB1, VC1, VD1 can each comprise a respective phase voltage component having a low-frequency (i.e., a fundamental frequency), and a respective common mode voltage component (hereinafter, Vcm) having a respective high-frequency that is higher than the fundamental frequency.

For example, the CMVC circuit input 129 can be conductively connected with the primary windings 211, 212, 213, 214 and secondary windings 221, 222, 223, 224 of the set of coupled inductors 200. Each respective AC input first phase voltage VA1, VB1, VC1, VD1 or input line 113 thereof, is communicatively coupled with a respective coupled inductor 201, 202, 203, 204 of the set of coupled inductors 200 to provide the respective AC first phase voltage VA1, VB1, VC1, VD1 thereto. For example, as shown, the first phase voltage (VA1) is communicatively coupled with the first coupled inductor 201, the second phase voltage (VB1) is communicatively coupled with the second coupled inductor 202, the third phase voltage (VC1) is communicatively coupled with the third coupled inductor 203, and the fourth phase voltage (VD1) is communicatively coupled with the fourth coupled inductor 204. In an aspect, each primary winding 211, 212, 213, 214 of the set of coupled inductors 200 can be communicatively coupled at a respective upstream end to the respective input line 113 via a corresponding node, designated 281, 282, 283, 284, respectively. As depicted in FIG. 2, primary winding 211 can be communicatively coupled to a respective input line 113 associated with phase voltage VA1 at a first node 281, primary winding 212 can be communicatively coupled to a respective input line 113 associated with phase voltage VB1 at a second node 282, primary winding 213 can be communicatively coupled to a respective input line 113 associated with phase voltage VC1 at a third node 283, and primary winding 214 can be communicatively coupled to a respective input line 113 associated with phase voltage VD1 at a fourth node 284. Each of the primary windings 211, 212, 213 can be coupled at a respective downstream end to electrical ground. In one non-limiting aspect of the disclosure, each respective primary winding 211, 212, 213, 214 of the set of coupled inductors 200 can be configured to receive a respective first phase voltage VA1, VB1, VC1, VD1 between the input 129 of the CMVC circuit 130 and electrical ground (GND) or neutral.

The input lines 113 can additionally provide the respective first phase voltages VA1, VB1, VC1, VD1 having the common mode voltage component Vcm, to the corresponding secondary windings 221, 222, 223, 224 of the set of coupled inductors 200. In an aspect, the respective secondary windings 221, 222, 223, 224 of the set of coupled inductors 200 can be electrically coupled in series with a respective input line 113 via a respective node 281, 282, 283, 284 to receive the respective first phase voltage VA1, VB1, VC1, VD1 (having the respective common mode voltage component Vcm), therefrom. For example, as depicted in FIG. 2, secondary winding 221 can be communicatively coupled to the respective input line 113 associated with phase voltage VA1 at the first node 281, secondary winding 222 can be communicatively coupled to the respective input line 113 associated with phase voltage VB1 at the second node 282, secondary winding 223 can be communicatively coupled to the respective input line 113 associated with phase voltage VC1 at the third node 283, and secondary winding 224 can be communicatively coupled to the respective input line 113 associated with phase voltage VD1 at the fourth node 284.

When the respective first phase voltage VA1, VB1, VC1, VD1 (including the respective common mode component Vcm) is provided to the respective primary winding 211, 212, 213 of the set of coupled inductors 200, a second phase voltage VA2, VB2, VC2, VD2 is induced at the corresponding secondary windings 221, 222, 223 of the set of coupled inductors 200.

A third phase voltage VA3, VB3, VC3, VD3 can be defined at a respective downstream end of the secondary windings 221, 222, 223, 224 of the set of coupled inductors 200. The third phase voltage VA3, VB3, VC3, VD3 can be a sum of the respective first phase voltage VA1, VB1, VC1, VD1 including the common mode voltage component Vcm, received at the respective node 281, 282, 283, 284 and the respective induced second voltage VA2, VB2, VC2, VD2. The secondary windings 221, 222, 223, 224 can be coupled at a respective downstream end to a respective output line 114 to provide the third phase voltage VA3, VB3, VC3, VC3 thereto. In aspects, each respective input line 113 is coupled in series with a respective output line 114 via a respective secondary winding 221, 222, 223, 224 of the set of coupled inductors 200.

It will be appreciated that the capacitive reactance (designated herein, "XC") associated with each respective capacitor 251, 252, 253, 254 arranged in the respective series resonant circuits 271, 272, 273, 274 can be represented by the equation:

$$XC = \frac{1}{2\pi fC},$$

wherein "f" is the frequency of the voltage, and "C" is the capacitance of the respective capacitor 251, 252, 253, 254. It will be further appreciated that when the voltage frequency is low, for example at the fundamental frequency of the phase voltage VA1, VB1, VC1, VD1 (e.g., 400 Hz), the capacitive reactance XC of each respective capacitor 251, 252, 253, 254 is relatively high, due to the low frequency of the phase voltage VA1, VB1, VC1, VD1. In this way, at relatively low fundamental frequencies of the phase voltage VA1, VB1, VC1, VD1 the respective capacitor 251, 252, 253, 254 of each series resonant circuit 271, 272, 273, 274 has a relatively high capacitive reactance XC, and can be considered to essentially act as an open circuit, thereby preventing the low frequency component of the phase voltage VA1, VB1, VC1, VD1 from being provided to the corresponding primary winding 211, 212, 213, 214 of the respective series resonant circuit 271, 272, 273, 274. Conversely, it will be further appreciated that for relatively high frequency voltage component, for example the high-frequency (e.g., 20 KHz) common mode voltage component Vcm, the capacitive reactance XC of each respective capacitor 251, 252, 253, 254 is relatively low, due to the high frequency of the common mode voltage component Vcm. In this way, at relatively high frequencies, the capacitor 251, 252, 253, 254 of each respective series resonant circuit 271, 272, 273, 274 essentially acts as a short-circuit, thereby enabling the high frequency component of the common mode voltage component Vcm to be applied or provided to the corresponding primary winding 211, 212, 213, 214 of the respective series resonant circuit 271, 272, 273, 274.

It will be appreciated that each primary winding 211, 212, 213, 214 of the set of coupled inductors 200 comprises or defines a coil or inductor. Thus, the inductive reactance (designated herein, "XL") associated with each respective primary winding 211, 212, 213, 214 of the respective series resonant circuit 271, 272, 273, 274 can be represented by the equation: $XL=2\pi fL$, wherein "f" is the frequency of the voltage, and "L" is the inductance of the respective inductor (i.e., the respective primary winding 211, 212, 213, 214) of each series resonant circuit 271, 272, 273, 274. It will be further appreciated that when the voltage frequency is low, for example at the fundamental frequency of the phase voltage VA1, VB1, VC1, VD1 (e.g., 400 Hz), the inductive reactance XL of each respective primary winding 211, 212, 213, 214 is relatively low, due to the low frequency of the phase voltage VA1, VB1, VC1, VD1. In this way, at relatively low fundamental frequencies of the phase voltage VA1, VB1, VC1, VD1, the respective inductor (i.e., the respective primary winding 211, 212, 213, 214) of each series resonant circuit 271, 272, 273, 274 has a relatively low inductive reactance XL, and can be considered to essentially act as a short-circuit, thereby providing a low reactance or short-circuit path to ground across the respective primary winding 211, 212, 213, 214 for the low frequency component of the phase voltage VA1, VB1, VC1, VD1.

It will also be further appreciated that for voltages having a relatively high frequency, for example the high-frequency (e.g., 20 KHz) common mode voltage component Vcm, the inductive reactance XL of each respective primary winding 211, 212, 213, 214 will be relatively high, due to the high frequency of the common mode voltage component Vcm. In this way, at relatively high frequencies, the respective primary winding 211, 212, 213, 214 of each series resonant circuit 271, 272, 273, 274 essentially acts as an open-circuit, thereby providing the high frequency component of the common mode voltage component Vcm to the primary winding 211, 212, 213 of the respective series resonant circuit 271, 272, 273, 274.

For each series resonant circuit 271, 272, 273, 274, a resonant frequency can be defined as the frequency at which the capacitive reactance XC is equal to the inductive reactance XL (i.e., XC=XL). At the resonant frequency, the capacitive reactance XC will be equal to and opposite the inductive reactance XL, and the two reactances will essentially cancel each other, thereby making the series-connected inductor (i.e., the respective primary winding 211, 212, 213, 214 and capacitor 251, 252, 253, 254 cooperate to essentially act as a short-circuit with the only opposition to current flow in the series resonant circuit 271, 272, 273, 274 effectively being the resistance of the respective resistor 261, 262, 263, 264 of the series resonant circuit 271, 272, 273, 274. In an aspect, each respective series connected capacitor 251, 252, 253, 254, resistor 261, 262, 263, 264, and primary winding 211, 212, 213, 214 are configured to define the respective series resonant circuit 271, 272, 273, 274 having essentially zero reactance at the resonant frequency. Accordingly, in non-limiting aspects, each respective series connected capacitor 251, 252, 253, 254, resistor 261, 262, 263, 264, and primary winding 211, 212, 213, 214 of each respective series resonant circuit 271, 272, 273, 274 are further configured to absorb a respective current at the resonant frequency.

As discussed above, in an aspect, any applied voltage across the primary winding 211, 212, 213, 214 of each coupled inductor 201, 202, 203, 204 will induce the respective second phase voltage VA2, VB2, VC2, VD2 at the respective secondary windings 221, 222, 223, 224 that is proportional to the applied voltage, (i.e., based on the mutual inductance and turns ratio of the respective primary winding 211, 212, 213, 214 and secondary windings 221, 222, 223, 224). The magnitude of the induced voltage at the respective secondary windings 221, 222, 223, 224 of the set of coupled inductors 200 will depend on the turns or winding ratio of the at primary windings 211, 212, 213, 214 to the corresponding secondary windings 221, 222, 223, 224. For ease of understanding and explanation, the aspect depicted in FIG. 2 is described herein with respect to the set of coupled inductors 200 as having a respective ratio of turns of the primary winding 211, 212, 213, 214 with respect to the turns of the secondary winding 221, 222, 223, 224 of 1:1. In various other aspects, the set of coupled inductors 200 may comprise any desired winding ratio without departing from the scope of the aspects herein.

For ease of understanding, as shown in the drawings, a conventional "dot" depicted adjacent to a conventional coupled inductor winding symbol is used to indicate the polarity of a given winding. As will be understood, the term "polarity" refers to the relative direction of the induced voltages between the primary and secondary windings at any given moment in the AC cycle, and the voltage drop from polarity to non-polarity across one winding is essentially in phase with the voltage drop from polarity to non-polarity across the other winding(s). Thus, a positively increasing current in the dotted terminal of one winding induces a positive voltage at the dotted terminal of the other respective winding. For example, when so arranged, (i.e., having the same polarity orientation, following left to right on their respective secondary windings 221, 222, 223, 224), the set of coupled inductors 200 can be considered to have additive polarity.

The second voltage VA2, VB2, VC2, VD2 induced on the secondary windings 221, 222, 223, 224 can be proportional to the voltage (i.e, the first phase voltage VA1, VB1, VC1, VD1 including the common mode voltage component Vcm) across the corresponding primary windings 211, 212, 213, 214. In an aspect, since the phase voltage component VA1, VB1, VC1, VD1 across the primary windings 211, 212, 213, 214 comprises a voltage having relatively low-frequency (i.e., the fundamental frequency), the induced second voltage VA2, VB2, VC2, VD2 at the secondary windings 221, 222, 223, 224 can essentially be limited to the high-frequency common mode voltage component Vcm, (i.e., due to the low-frequency voltage blocking effect of the capacitor 251, 252, 253, 254 of the respective series resonant circuit 271, 272, 273, 274.) For example, in an aspect, assuming a turns ratio of each respective primary winding 211, 212, 213, 214 with respect to the corresponding secondary winding 221, 222, 223, 224 of 1:1, the second phase voltage VA2, VB2, VC2, VD2 induced across the secondary winding 221, 222, 223, 224 is proportional to the common mode voltage component Vcm. Furthermore, the set of coupled inductors 200 can be configured to have a relative second polarity of the secondary windings 221, 222, 223, 224 that is opposite the relative first polarity of the corresponding primary windings 211, 212, 213, 214. Based on the opposite relative first and second polarities of the primary windings 211, 212, 213, 214 and secondary windings 221, 222, 223, 224 respectively, the second voltage VA2, VB2, VC2, VD2 induced at the secondary windings 221, 222, 223, 224 will be proportional to the common mode voltage component Vcm with respect to ground, and 180 degrees out of phase with the common mode voltage component Vcm at the primary windings 211, 212, 213, 214. Accordingly, the third phase voltage VA3, VB3, VC3, VD3 with respect to ground at the downstream end of the secondary windings 221, 222, 223, 224 can be the sum of the respective common mode voltage component Vcm, received at the respective node 281, 282, 283, 284 and the respective induced second voltage VA2, VB2, VC2, VD2 including the common mode voltage component Vcm, with the summed respective common mode voltage Vcm components being 180 degrees out of phase. When two such AC voltages being 180 degrees out of phase with each other are combined or summed, they essentially cancel each other resulting in a voltage with respect to ground being essentially equal to zero. Thus, the third phase voltage VA3, VB3, VC3, VD3 with respect to ground will be equal to the respective phase voltage VA1, VB1, VC1, VD1 with the common mode voltage component Vcm cancelled therefrom.

In this way, the primary windings 211, 212, 213 of the set of coupled inductors 200 cooperate with the secondary windings 221, 222, 223, 224 to modify or adjust the respective first phase voltages VA1, VB1, VC1, VD1 to operatively cancel or reduce the common mode voltage component Vcm from the input phase voltage (e.g. due to the opposite relative polarity of the primary windings 211, 212, 213, 214 of the set of coupled inductors 200 relative to the relative polarity of the secondary windings 221, 222, 223, 224 of the set of coupled inductors 200), resulting in the third phase voltage VA3, VB3, VC3, VD3. That is, the respective third phase voltages VA3, VB3, VC3, VD3 are equal to the respective first phase voltages VA1, VB1, VC1, VD1 with the common mode voltage component Vcm cancelled or subtracted therefrom. The respective third phase voltage VA3, VB3, VC3, VD4 can then be provided downstream from the corresponding secondary windings 221, 222, 223, 224 of the secondary windings to the electrical load 140, via respective transmission output lines 114. For example, in an aspect, the "clean" respective third phase voltage VA3, VB3, VC3, VD3 can then be provided via power transmission output line 114 to an additional circuitry such as a conventional Inductor-Capacitor (LC) filter (not shown), or to the electrical load 140 (not shown).

As noted hereinabove, while the non-limiting aspect depicted in FIG. 2 is described herein as each coupled inductor 201, 202, 203, 204 having a primary to secondary winding ratio of 1:1, other aspects are not so limited. In other aspects, each coupled inductor 201, 202, 203, 204 can comprise other primary-to-secondary winding ratios without departing from the scope described herein. For example, in an aspect each coupled inductor 201, 202, 203, 204 of the set of coupled inductors 200 can comprise a winding ratio substantially equal to T:1, wherein T is greater than 1. In such aspects, the third voltage VA3, VB3, VC3, VD3 with respect to ground at the respective downstream end of each secondary winding 221, 222, 223, 224 of the set of coupled inductors 200 can include a common mode voltage component Vcm proportional to the common mode voltage component Vcm of the respective first phase voltage VA1, VB1, VC1, VD1.

It will be understood that, while FIG. 2 depicts the CMVC circuit 130 being communicatively coupled with respective power transmission output lines 114 to provide the respective third phase voltage VA3, VB3, VC3, VD3 thereto, other aspects are not so limited. It is contemplated that other aspects of the CMVC circuit 130 can comprise any desired number of power transmission output lines 114, having any desired number of phase and frequency orientations, without departing from the scope of the disclosure herein.

FIG. 3 illustrates a flow chart demonstrating a method 300 of reducing or cancelling a common-mode voltage Vcm by utilizing aspects of the CMVC circuits described herein. The method 300 begins, at 310, by communicatively coupling a respective upstream end of a respective primary winding 211, 212, 213, 214 of a set of coupled inductors 200 with a respective input line 113 to receive a respective first phase voltage VA1, VB1, VC1, VD1 having a common mode voltage component Vcm, therefrom. The method 300 includes, at 315, communicatively coupling a downstream end of each respective primary winding 211, 212, 213, 214 to electrical ground. The method 300 includes communicatively coupling a respective upstream end of a corresponding secondary winding 221, 222, 223, 224 of the set of coupled inductors 200 with a respective input line 113 to receive the respective first phase voltage VA1, VB1, VC1, VD1 having a common mode voltage component Vcm, therefrom, at 320. Then at 325, communicatively coupling a downstream end of each respective secondary winding 221, 222, 223, 224 with a respective output line 114 in series with a respective input line 113.

In non-limiting aspects, the method 300 can include defining a relative first polarity for each primary winding 211, 212, 213, 214 of the set of coupled inductors 200 and a relative second polarity for each corresponding secondary winding 221, 222, 223, 224 at 330. In an aspect, the first polarity can be opposite the relative second polarity. The method 300 further includes, at 335, communicatively coupling a respective capacitor 251, 252, 253, 254 electrically in series with a respective primary winding 211, 212, 213, 214. For example, in an aspect, the respective capacitor 251, 252, 253, 254 can be electrically coupled with a respective input line 113 and electrically in series between the respective input line 113 and with a respective primary winding 211, 212, 213, 214. In other aspects the respective capacitor 251, 252, 253, 254 can be electrically coupled in series with, and downstream from a respective primary winding 211, 212, 213, 214. Some non-limiting aspects of method 300 can include, at 340, coupling a respective resistor 261, 262, 263, 264 electrically in series with a respective inductor primary winding 211, 212, 213, 214 and the capacitor 251, 252, 253, 254 of the set of capacitors 250.

The method 300 can include inducing a second voltage VA2, VB2, VC2, VD2 on each respective secondary winding 221, 222, 223, 224 via a respective primary winding 211, 212, 213, 214 of the set of coupled inductors 200, at 345. In an aspect, the second voltage VA2, VB2, VC2, VD2 can be 180 degrees out of phase from the respective first voltage VA1, VB1, VC1, VD1. The method 300 can include, at 350 providing or coupling a third voltage VA3, VB3, VC3, VD3 with respect to electrical ground, from each respective secondary winding 221, 222, 223, 224 to a respective output line 114, wherein the third voltage VA3, VB3, VC3, VD3 comprises a sum of the first voltage VA1, VB1, VC1, VD1 and the second voltage VA2, VB2, VC2, VD2. In an aspect, the respective third voltage VA3, VB3, VC3, VD3 can be equal to the first phase voltage VA1, VB1, VC1, VD1 with the common mode voltage Vcm reduced therefrom.

The sequence depicted is for illustrative purposes only and is not meant to limit the method 300 in any way as it is understood that the portions of the method can proceed in a different logical order, additional or intervening portions can be included, or described portions of the method can be divided into multiple portions, or described portions of the method can be omitted without detracting from the described method.

The aspects disclosed herein provide a common-mode voltage cancellation or reduction circuit and method. The technical effect is that the above described aspects enable the cancellation or reduction of the common-mode voltage in a power supply system. One advantage that can be realized in the above aspects is that the above described aspects enable the use of smaller, lighter, and less expensive LC filters compared with conventional systems.

To the extent not already described, the different features and structures of the various aspects can be used in combination with each other as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

Further aspects are provided by the subject matter of the following clauses:

A common-mode voltage cancellation (CMVC) circuit comprising a set of input lines arranged to receive a respective phase voltage; a set of output lines arranged to provide a respective output phase voltage; a set of coupled inductors, each coupled inductor of the set of coupled inductors having a respective primary winding, and a respective secondary winding, each primary winding and secondary winding coupled in signal communication at a respective upstream end to a respective input line to receive a respective phase voltage therefrom, each respective phase voltage having a common-mode voltage component; each primary winding of the set of coupled inductors being coupled at a respective downstream end to ground; each secondary winding of the set of coupled inductors being coupled in series between the respective input line and a respective output line; and a set of capacitors, each capacitor of the set of capacitors being electrically coupled in series with a respective primary winding of the set of coupled inductors.

The CMVC circuit of the previous clause, wherein the respective primary windings of the set of coupled inductors are arranged to define a first polarity, and the secondary windings of the set of coupled inductors are arranged to define a second polarity, wherein the first polarity and second polarity are opposite each other.

The CMVC circuit of any preceding clause, wherein a turns ratio of each respective primary winding with respect to the respective secondary winding is substantially equal to 1:1.

The CMVC circuit of any preceding clause, wherein a voltage induced across each secondary winding of the set of coupled inductors is out of phase with the common mode voltage component of the respective phase voltage.

The CMVC circuit of any preceding clause, wherein a turns ratio of each respective primary winding with respect to the respective secondary winding is substantially equal to T:1, wherein T is greater than 1.

The CMVC circuit of any preceding clause, wherein a voltage with respect to ground at a respective downstream end of each secondary winding of the set of coupled inductors includes a common mode voltage component proportional to the common mode voltage component of the respective phase voltage.

The CMVC circuit of any preceding clause, wherein the CMVC circuit is a polyphase AC circuit having a number of electrical phases, and wherein the set of coupled inductors comprises at least N coupled inductors, wherein N is equal to the number of electrical phases in the CMVC circuit.

The CMVC circuit of any preceding clause, further comprising a set of resistors, a respective resistor of the set of resistors electrically coupled in series with each capacitor of the set of capacitors.

The CMVC circuit of any preceding clause, wherein each respective series connected capacitor, resistor, and primary winding are configured to define a series resonant circuit with essentially zero reactance at a resonant frequency.

The CMVC circuit any preceding clause, wherein each respective series connected capacitor, resistor, and primary winding are further configured to absorb a current at the resonant frequency.

A method of cancelling a common-mode voltage in a circuit, comprising: communicatively coupling a respective upstream end of a respective primary winding of a set of coupled inductors with a respective input line to receive a respective first phase voltage having a common mode voltage component Vcm, therefrom; communicatively coupling a downstream end of each respective primary winding to ground; communicatively coupling a respective upstream end of each respective secondary winding of the set of coupled inductors with a respective input line to receive the respective first phase voltage having a common mode voltage component therefrom; communicatively coupling a downstream end of each respective secondary winding with a respective output line in series with a respective input line; coupling a respective capacitor electrically in series with a respective primary winding; inducing a second voltage on each respective secondary winding via a respective primary winding of the set of coupled inductors; and coupling a third voltage with respect to ground, from each respective secondary winding downstream end in series with a respective output line, wherein the third voltage comprises a sum of the first voltage and the induced second voltage.

The method of any preceding clause, further comprising defining a relative first polarity for each primary winding of the set of coupled inductors and a relative second polarity for each corresponding secondary winding, wherein the first polarity and second polarity are opposite each other.

The method of any preceding clause, wherein a turns ratio of each respective primary winding with respect to the respective secondary winding is substantially equal to 1:1.

The method of any preceding clause, wherein a voltage across each secondary winding of the set of coupled inductors is out of phase with the common mode voltage component.

The method of any preceding clause, wherein a turns ratio of each respective primary winding with respect to the respective secondary winding is substantially equal to T:1, wherein T is greater than 1.

The method of any preceding clause, wherein the voltage with respect to ground at the downstream end of each secondary winding of the set of coupled inductors includes a common mode voltage component proportional to the common mode voltage component of the respective phase voltage.

The method of any preceding clause, wherein the circuit is a polyphase circuit comprising a number of electrical phases, and the set of coupled inductors comprises at least N coupled inductors, wherein N is equal to the number of electrical phases in the polyphase circuit.

The method of any preceding clause, further comprising coupling a respective resistor electrically in series with each primary winding of the set of coupled inductors.

The method of any preceding clause, wherein each respective series connected capacitor, resistor, and primary winding define a series resonant circuit with essentially zero reactance at a resonant frequency.

The method of any preceding clause, wherein each respective series connected capacitor, resistor, and primary winding are further configured to absorb a current at the resonant frequency.

This written description uses examples to disclose aspects of the disclosure, including the best mode, and also to enable any person skilled in the art to practice aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A common-mode voltage cancellation (CMVC) circuit comprising:
a set of input lines arranged to receive a respective phase voltage;
a set of output lines arranged to provide a respective output phase voltage;
a set of coupled inductors, each coupled inductor of the set of coupled inductors having a respective primary winding, and a respective secondary winding, each primary winding and secondary winding coupled in signal communication at a respective upstream end to a respective input line to receive a respective phase voltage therefrom, each respective phase voltage having a common-mode voltage component;
each primary winding of the set of coupled inductors being coupled at a respective downstream end to ground;
each secondary winding of the set of coupled inductors being coupled in series between the respective input line and a respective output line;
a set of capacitors, each capacitor of the set of capacitors being electrically coupled in series with a respective primary winding of the set of coupled inductors; and a set of resistors, a respective resistor of the set of resistors electrically coupled in series with a corresponding capacitor of the set of capacitors.

2. The CMVC circuit of claim 1, wherein the respective primary windings of the set of coupled inductors are arranged to define a first polarity, and the secondary windings of the set of coupled inductors are arranged to define a second polarity, wherein the first polarity and second polarity are opposite each other.

3. The CMVC circuit of claim 2, wherein a turns ratio of each respective primary winding with respect to the respective secondary winding is substantially equal to 1:1.

4. The CMVC circuit of claim 3, wherein a voltage induced across each secondary winding of the set of coupled inductors is out of phase with the common mode voltage component of the respective phase voltage.

5. The CMVC circuit of claim 2, wherein a turns ratio of each respective primary winding with respect to the respective secondary winding is substantially equal to T:1, wherein T is greater than 1.

6. The CMVC circuit of claim 5, wherein a voltage with respect to ground at a respective downstream end of each secondary winding of the set of coupled inductors includes a second common mode voltage component proportional to the common mode voltage component of the respective phase voltage.

7. The CMVC circuit of claim 1, wherein the CMVC circuit is a polyphase AC circuit having a number of electrical phases, and wherein the set of coupled inductors comprises at least N coupled inductors, wherein N is equal to the number of electrical phases in the CMVC circuit.

8. The CMVC circuit of claim 1, wherein each respective series connected capacitor, resistor, and primary winding is configured to define a series resonant circuit with substantially zero reactance at a resonant frequency.

9. The CMVC circuit of claim 8, wherein each respective series connected capacitor, resistor, and primary winding is further configured to absorb a current at the resonant frequency.

10. A method of cancelling a common-mode voltage in a circuit, comprising:
communicatively coupling a respective upstream end of a respective primary winding of a set of coupled inductors with a respective input line to receive a respective first phase voltage having a common mode voltage component Vcm, therefrom;
communicatively coupling a downstream end of each respective primary winding to ground;
communicatively coupling a respective upstream end of each respective secondary winding of the set of coupled inductors with a respective input line to receive the respective first phase voltage having a common mode voltage component therefrom;
communicatively coupling a downstream end of each respective secondary winding with a respective output line in series with a respective input line;
coupling a respective capacitor and a respective resistor electrically in series with a corresponding primary winding of the set of coupled inductors;
inducing a second voltage on each respective secondary winding via a respective primary winding of the set of coupled inductors; and
coupling a third voltage with respect to ground, from each respective secondary winding downstream end in series with a respective output line, wherein the third voltage comprises a sum of the first voltage and the induced second voltage.

11. The method of claim 10, wherein the circuit is a polyphase circuit comprising a number of electrical phases, and the set of coupled inductors comprises at least N coupled inductors, wherein N is equal to the number of electrical phases in the polyphase circuit.

12. The method of claim 10, further comprising defining a relative first polarity for each primary winding of the set of coupled inductors and a relative second polarity for each corresponding secondary winding, wherein the first polarity and second polarity are opposite each other.

13. The method of claim 12, wherein a turns ratio of each respective primary winding with respect to the respective secondary winding is substantially equal to 1:1.

14. The method of claim 13, wherein the second voltage across each secondary winding of the set of coupled inductors is out of phase with the common mode voltage component.

15. The method of claim 12, wherein a turns ratio of each respective primary winding with respect to the respective secondary winding is substantially equal to T:1, wherein T is greater than 1.

16. The method of claim 15, wherein the third voltage with respect to ground at the downstream end of each secondary winding of the set of coupled inductors includes a second common mode voltage component proportional to the common mode voltage component of the respective phase voltage.

17. The method of claim 10, wherein each respective series connected capacitor, resistor, and primary winding defines a series resonant circuit with essentially zero reactance at a resonant frequency.

18. The method of claim 17, wherein each respective series connected capacitor, resistor, and primary winding is further configured to absorb a current at the resonant frequency.

* * * * *